United States Patent
Kuepfer et al.

(10) Patent No.: US 7,983,746 B2
(45) Date of Patent: Jul. 19, 2011

(54) ACTIVE EMC FILTER FOR MEDICAL APPLICATIONS

(75) Inventors: Roland Kuepfer, Schönbühl (CH); Peter Kull, Rüttenen (CH)

(73) Assignee: Schaffner EMV AG, Luterbach (CH)

( * ) Notice: Subject to any disclaimer, the term of this patent is extended or adjusted under 35 U.S.C. 154(b) by 689 days.

(21) Appl. No.: 11/779,536

(22) Filed: Jul. 18, 2007

(65) Prior Publication Data
US 2008/0143433 A1 Jun. 19, 2008

Related U.S. Application Data

(63) Continuation of application No. PCT/EP2005/050576, filed on Feb. 9, 2005.

(51) Int. Cl.
*A61N 1/00* (2006.01)
(52) U.S. Cl. ......................................................... 607/2
(58) Field of Classification Search .................. 327/552; 307/129; 361/118; 363/39; 607/2
See application file for complete search history.

(56) References Cited

U.S. PATENT DOCUMENTS

| 4,402,028 | A | 8/1983 | Udren |
| 5,666,255 | A | 9/1997 | Muelleman |
| 6,775,157 | B2 | 8/2004 | Honda |
| 2002/0171473 | A1 | 11/2002 | Pelly |
| 2003/0128558 | A1 | 7/2003 | Takahashi et al. |
| 2003/0218498 | A1 | 11/2003 | Pelly |
| 2004/0008527 | A1 * | 1/2004 | Honda ............................ 363/39 |

FOREIGN PATENT DOCUMENTS

| EP | 1069673 | 1/2001 |
| WO | WO-99/01932 | 6/1988 |
| WO | WO-03/005578 | 1/2003 |

OTHER PUBLICATIONS

Quian Zhaoming et al., "Status of electromagnetic compatibility research in power electronics," The Third International Power Electronics and Motion Control Conference, Aug. 15-18, 2000, IEEE, vol. 1, Aug. 15, 2000, pp. 46-57.

I. Takahashi et al., "Active EMI filter for switching noise of high frequency inverters," Power Conversion Conference, Nagaoka, Japan, Aug. 3-6, 1997, IEEE, vol. 1, Aug. 3, 1997, pp. 331-334.

* cited by examiner

*Primary Examiner* — George Manuel
*Assistant Examiner* — Robert N Wieland
(74) *Attorney, Agent, or Firm* — Blank Rome LLP

(57) ABSTRACT

An active EMC filter for medical applications allows reducing the leakage current normally induced by large phase-to-ground capacitances. The filter may comprise an active shunt module or an impedance converter or a correction signal generator and is suitable both for three-phase and single-phase applications.

9 Claims, 4 Drawing Sheets

ACTIVE EMC FILTER FOR MEDICAL APPLICATIONS

REFERENCE DATA

This application is a continuation of International Patent Application PCT/EP2005/050576 (WO2006/084505) filed on Feb. 9, 2005, the contents whereof are hereby incorporated.

FIELD OF THE INVENTION

The present application relates to active electrical filters for suppressing unwanted noise component in medical electrical equipments. More particularly, but not exclusively, the present application deals with electromagnetic compatibility filters for mains lines or electrical supply lines of electrical medical equipment.

DESCRIPTION OF RELATED ART

Electromagnetic compatibility (EMC) is an increasingly critical factor in the electric and electronic industry nowadays. A large number of electric circuits and appliances exist, which are liable to generate unwanted Radio Frequency Electro-Magnetic Interference (RF EMI), or to suffer from interferences generated by other circuits or appliances.

The conducted noises and disturbances in electrical equipment are generally dealt with by inserting a low-pass LC filter on the mains supply line of the noise-generating devices or of the noise-sensitive devices. Such filters attenuate the unwanted frequency components to a harmless level. Many filter topologies, including the classic "L", "T" and "pi" filter topologies, can be employed.

European Patent application EP1069673 shows an example of a three-phase noise suppression filter comprising passive elements.

Passive EMC filters have been proven effective in a number of applications. A shortcoming of this technique, however, is that in order to attain the required attenuation level, high-value capacitors and inductances are needed for this application. The size and cost of the resulting filter are mainly determined by these large components, in particular when high attenuation of common mode noise is needed. Moreover, the leakage current is directly proportional to the capacity of the filter capacitors.

Electrical medical equipments have to fulfill special safety requirement, both concerning reliability and immunity to external disturbance and aimed at minimizing the risk of electrical shocks for patients connected to them. In particular leakage currents are of much more concern in medical equipment, where a patient may be the recipient of the shock. Even a low level of leakage current may be sufficient to provide a fatal shock to a weakened or unconscious patient, or if the leakage current is applied to internal organs.

Current safety regulation impose severe limit on the leakage current in medical equipment. This causes special problems for the power supply and the EMC filters of those equipments, in that the line-to-ground capacitors, usually denoted as "Y" capacitors, are both an important part of the EMC filter to function properly and a major source of leakage current.

The leakage current to ground due to the EMC filter can be lessened by reducing the value of the "Y" filtering capacitors. However this affects severely the effectiveness of the filter.

Increasing the inductance value of the filter choke can compensate the lower value of the "Y" capacitor, but only to a certain extent. Larger inductances have larger stray capacitance, which limits the attenuation, and are more costly and voluminous than conventional ones. Furthermore, the combination of a large inductance and a small capacity lessens the stability of the filter and can be the source of unwanted resonant oscillations.

It is an aim of the present invention to provide an EMC filter for medical electrical equipment exhibiting a low leakage current.

It is also an aim of the present invention to provide an EMC filter for medical electrical equipment with a production cost lower than that of the known devices.

It is another aim of the present invention to provide an EMC filter for medical electrical equipment which is more compact than the known devices.

BRIEF SUMMARY OF THE INVENTION

These aims are attained by the device which is the subject of the appended independent claims, optional and additional useful features being introduced in the dependent claims.

DETAILED DESCRIPTION OF THE INVENTION

Figure 1:
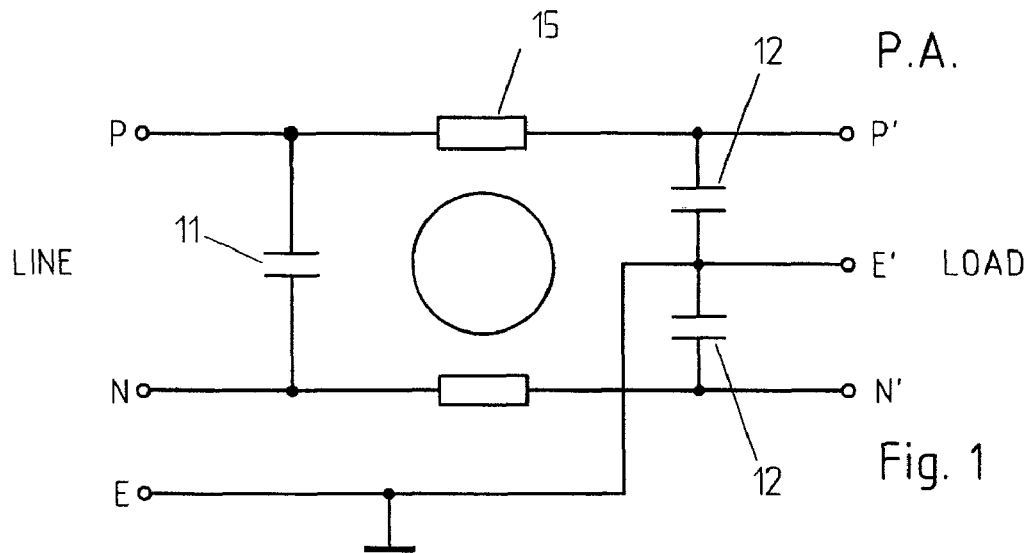
FIG. 1 represents an EMC passive filter of known type.

FIG. 1 represents a EMC passive filter of know type, comprising a current-compensated coil 15, an inter-phase capacitor 11 and two "Y" phase-to-ground capacitors 12. The "Y" capacitors 12 are effective in the suppression of common-mode interferences transmitted on the mains line, yet they are an important source of leakage current.

Figure 2:
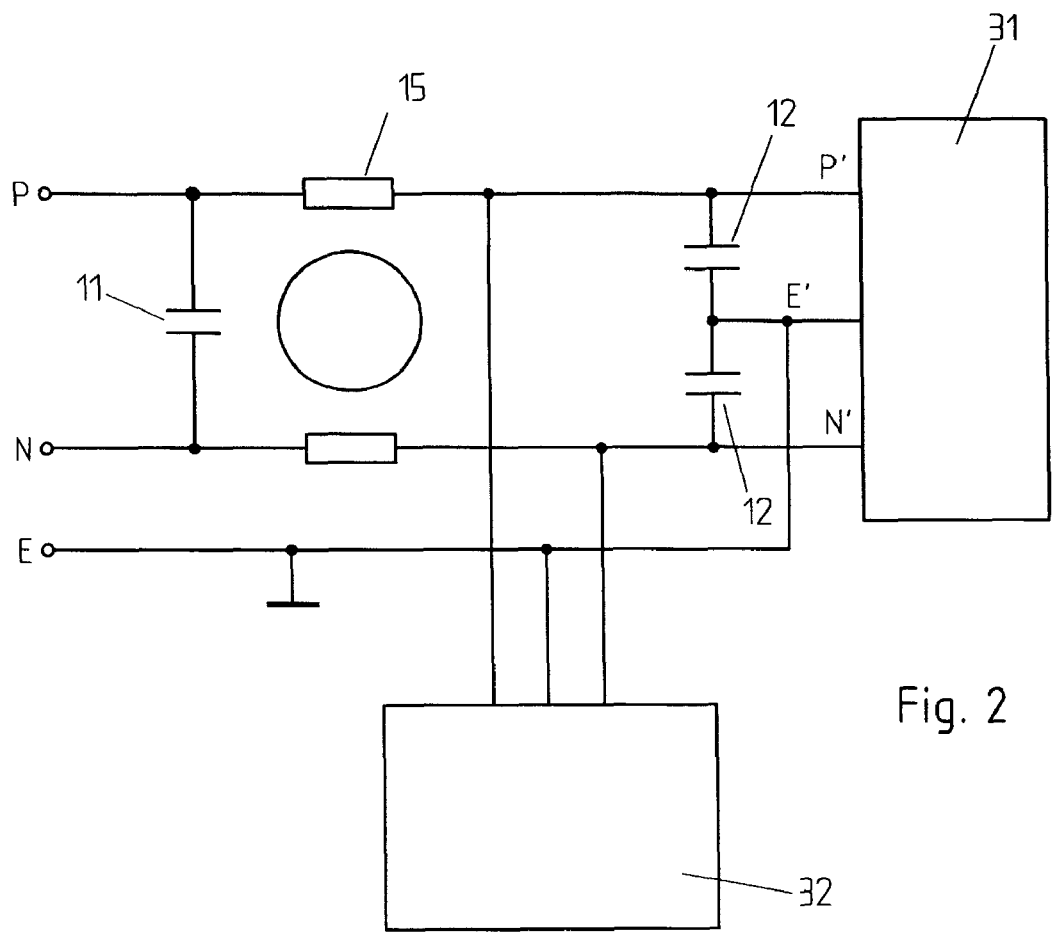
FIG. 2 represents a EMC filter connected to a medical device according to one aspect of the present invention.

According to one aspect of the invention, the EMC filter includes active elements for suppressing an unwanted RF EMI component conducted by the mains line, without increasing leakage current, like in conventional passive EMC filters. With reference to FIG. 2 an EMC filter according to the invention comprises a current-compensated coil 15 and an active shunt module 32 presenting a low impedance for the RF EMI component which is shunted to ground and prevented from reaching the medical equipment 31. The effectiveness of the active shunt module may be limited in the upper part of the frequency spectrum, due to the finite response time of electronics. In this case two small "Y" capacitors, introducing a negligible leakage, may be added for improving high frequency attenuation.

The EMC filter and the medical device represented on FIGS. 1 and 2 are drawn as single-phase devices. It is to be understood, however, that three-phase or multi-phase devices and filters are also possible, and comprised in the scope of the present invention.

Figure 3:
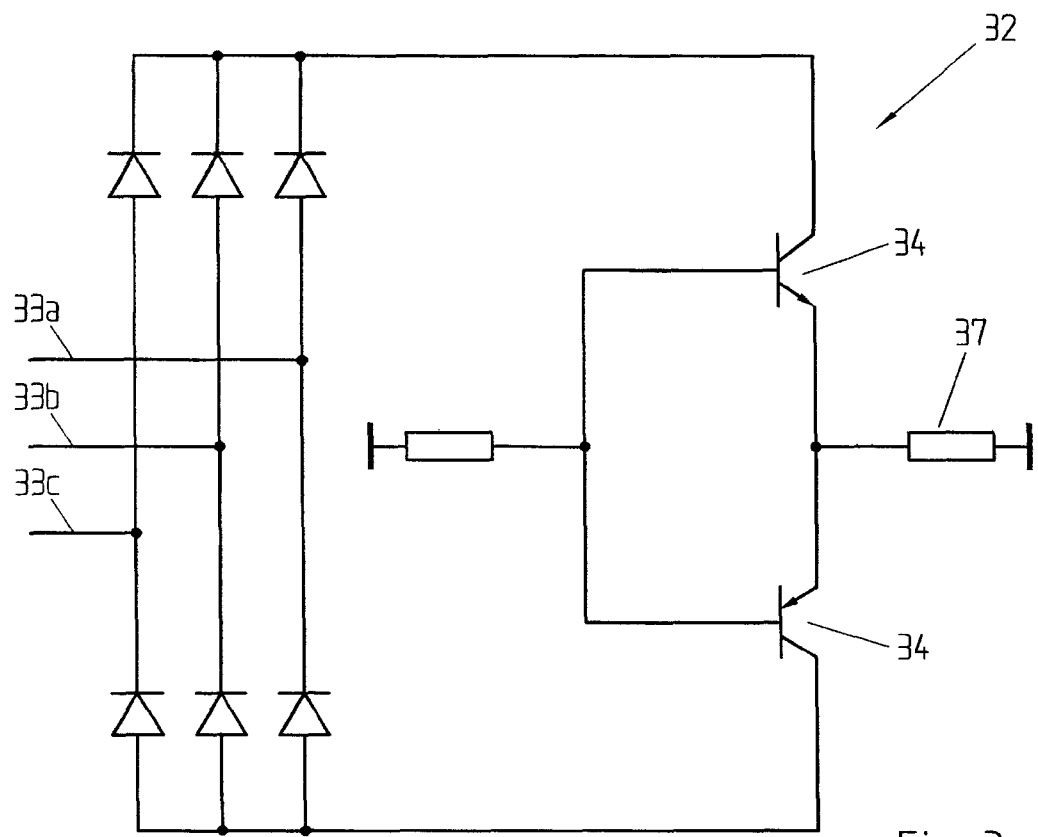
FIG. 3 represents an active part of the filter of FIG. 2.

An example of an active shunt module 32 is now discussed with reference to FIG. 3. This example refers to a three-phase circuit. It would be possible, in the scope of the invention, to modify it for a single-phase circuit. The active shunt 32 acts as a capacitive bypass for attenuating high frequency voltage components, notably noise, present on the power lines 33a, 33b and 33c. It comprises two complementary follower transistors 34 for shunting the RF EMI through the impedance 37.

Figure 7:
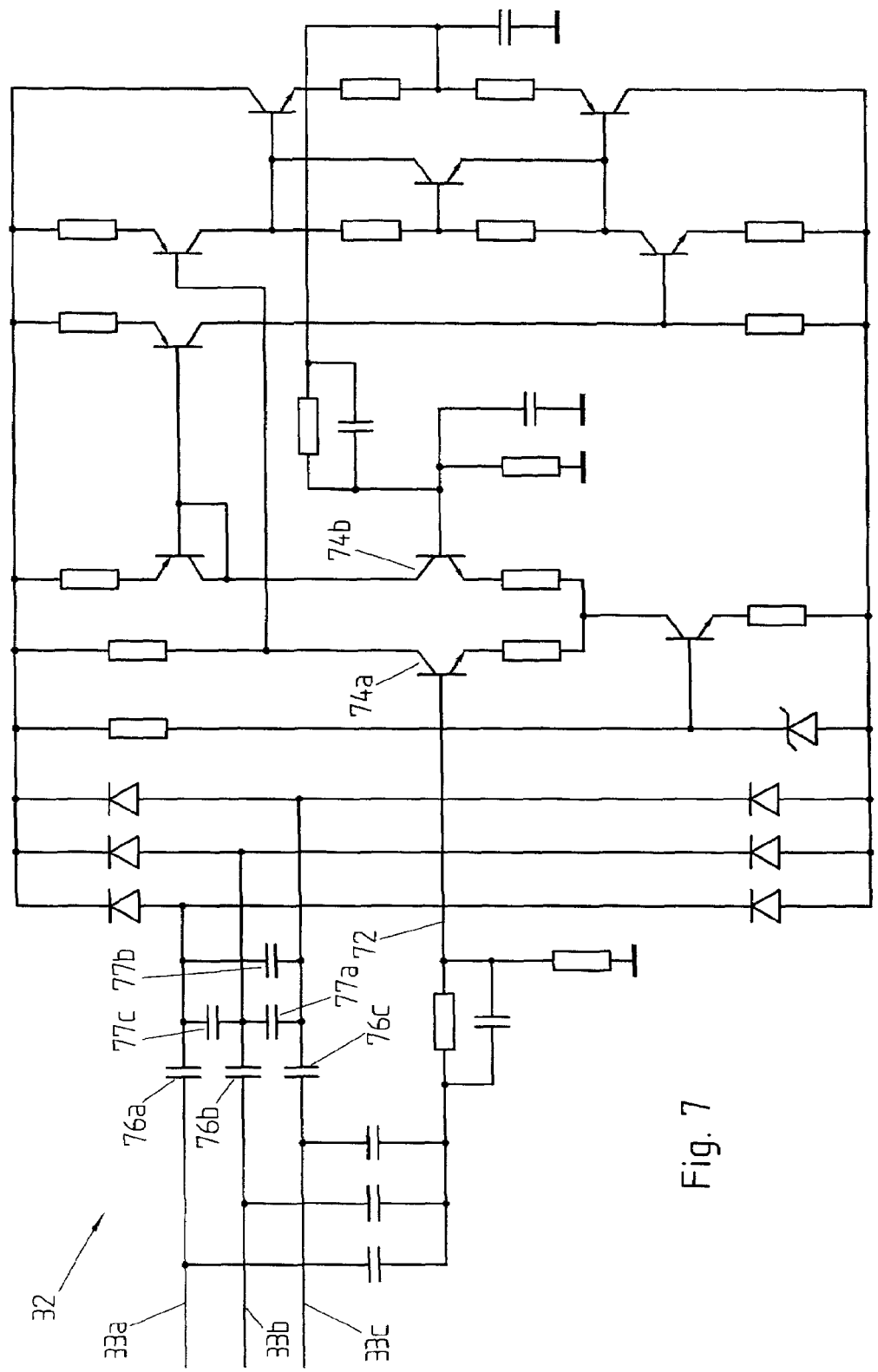
FIG. 7 shows another variant of shunt module for the filter of FIG. 2.

A further example of active shunt module 32 is presented in FIG. 7. The active module 32 is arranged for keeping the input point 72 at a potential close to ground potential, at frequencies where the unwanted noise is expected. The capacitors 76a, 76b 76c and 77a, 77b, 77c, form a voltage divider for the supply rails of the active shunt. In this way the active shunt module is supplied with a voltage which is lower than the mains voltage, for example one half of the mains voltage. This reduces the fault current to harmless levels, even in case of a breakdown of some component, and avoids the use of fuses, which have large stray inductance. Furthermore the device voltages in the active shunt are kept to manageable levels, by the capacitive divider.

The example shown above refers to the case of a three-phase mains supply. The present invention is not limited, however, to this disposition and the presented examples could easily be modified for operation in a single-phase supply line, should the need arise.

Figure 4:
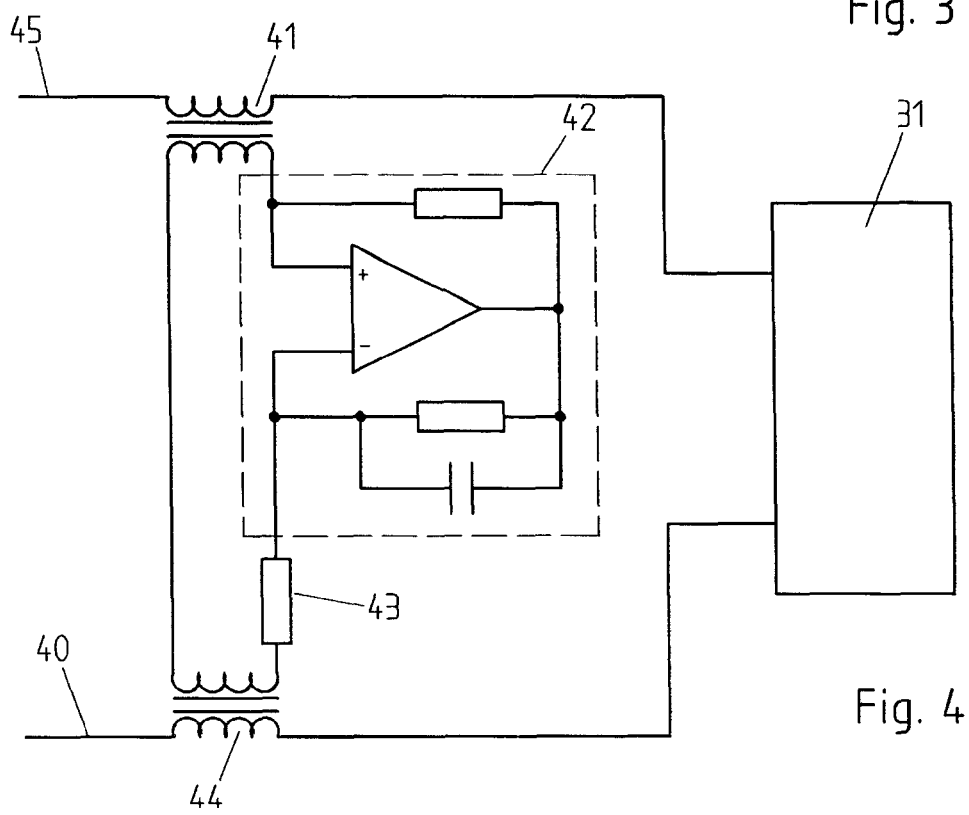
FIG. 4 shows a simplified diagram of a filter comprising a negative impedance converter according to one aspect of the invention.

FIG. 4 represents schematically another variant of an EMC filter according to the present invention. The filter comprises a Negative Impedance Converter (NIC) 42 thanks to which a winding of transformers 41 and 44 appear as a large series impedance to noise present on power lines 45, 40. The circuit of FIG. 4 allows effective filtering of the EMI to a medical device 31, by use of a small "Y" capacitor, which contributes negligibly to the leakage current.

Advantageously, in this case, the "Y" capacitors can be totally dispensed with entirely. The NIC circuit acts as a source of voltage which cancels the noise on lines 40 and 45.

Figure 5:
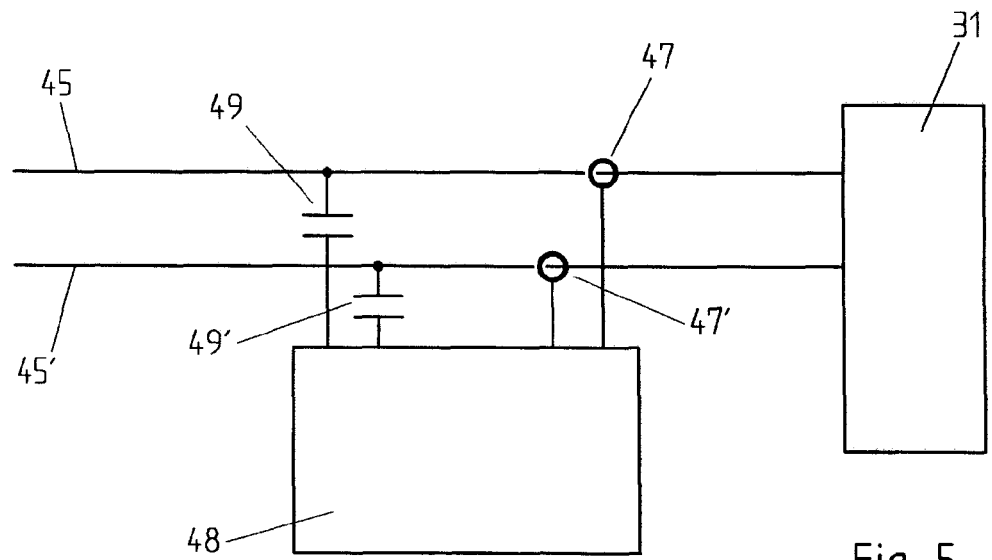
FIG. 5 shows a simplified diagram of a filter comprising a current pick-up detector according to one aspect of the invention.

FIG. 5 represent another variant of a filter according to the present invention comprising current sensors 47 and 47' and an active circuit 48 for injecting a noise correction current in the power lines 45 and 45', in order to cancel the EMI directed to the medical device 31. Isolation between the circuit 48 and the supply lines 54, 45' is provided by isolation capacitors 49 and 49'. The current sensor 47 comprises, for example a pickup coil, for reading the RF EMI circulating along the supply line 45.

Further, even if not represented, it is to be understood that one of the current sensor could be omitted, and, in a variant, only one of the lines could be sensed. In a further variant a magnetic coil could be coupled with both the power lines 45 and 45' in order to sense, for example, a common-mode noise component.

Figure 6:
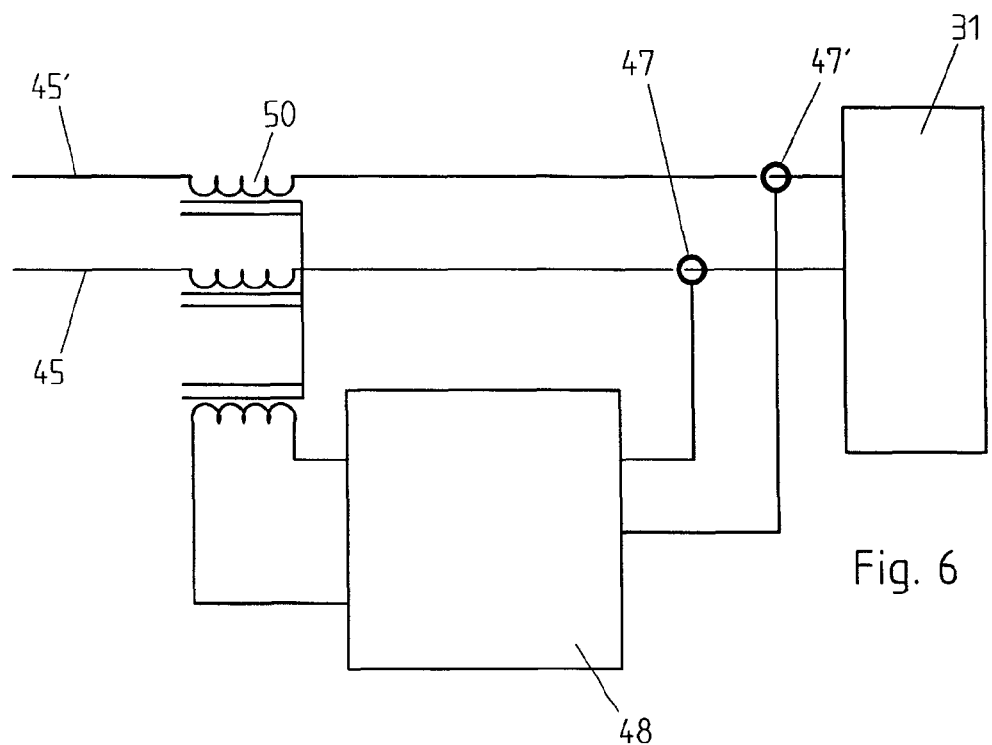
FIG. 6 shows a variant of the filter of FIG. 5.

FIG. 6 represents another variant of the filter of the invention in which the correction signal generated by the active module 49 is injected in the supply line 45, 45' by means of a transformer 50 magnetically coupling supply lines 45, 45' to the correction signal. It is to be understood that several forms of magnetic cores and windings bay be used for this purpose.

In one advantageous variant the transformer 50 constitutes, with respect to the power lines 45, 45', a current-compensated impedance.

In not represented variants of the embodiments of FIGS. 5 and 6, the current sensors 47 and 47' may be replaced by transformers or by pick-up capacitors as voltage sensors. These embodiments of the present invention could also be adapted for a three-phase configuration.

It is an advantage of the above embodiments that the circuit 48 is not directly connected to ground, and could, if necessary be completely floated. In this way the unwanted possibility of stray leakage currents is further reduced.

The EMC filter of the invention is preferably included in a system comprising also a medical equipment, connected to a mains supply line, the EMC filter providing attenuation of EMI transmitted along said supply line.

The invention claimed is:

1. System comprising an electrical medical device having a supply line and an electromagnetic compatibility (EMC) filter, inserted on the supply line of said electrical device, wherein said EMC filter comprises an active circuit for suppressing unwanted interferences from said supply line, wherein said EMC filter includes at least one inductance and an active shunt module for providing a low-impedance path for said interferences.

2. The system of claim 1, wherein said EMC filter is arranged for suppressing a common-mode interference transmitted on said supply line.

3. The system of claim 1, wherein said supply line is a single-phase or a three-phase mains line.

4. The system of claim 1, wherein said EMC filter further comprises phase-to-ground capacitors.

5. The system of claim 1, wherein said EMC filter comprises an impedance converter.

6. The system of claim 5, wherein said EMC filter comprises a transformer, one winding thereof being connected in series on said supply line, and another winding thereof being connected to a negative impedance converter.

7. The system of claim 1, wherein said filter comprises a voltage or current pick-up means, for detecting a disturbance signal on said supply line, an active circuit for generating a correction signal based on said disturbance signal, and a signal injection means for injecting said correction signal in said supply line.

8. The system of claim 1, wherein said filter further comprises a voltage reduction means for supplying said active circuit with a voltage that is lower than the voltage of said supply line.

9. A system comprising an electrical medical device and an EMC electric filter, inserted on a supply line of said electrical device, wherein said EMC filter comprises an active circuit for suppressing unwanted interferences from said supply line, wherein said EMC filter includes at least one current-compensated coil and an active shunt module for providing a low-impedance path for said interferences.

* * * * *